(12) United States Patent
Majumdar et al.

(10) Patent No.: US 6,639,295 B2
(45) Date of Patent: Oct. 28, 2003

(54) SEMICONDUCTOR DEVICE

(75) Inventors: Gourab Majumdar, Tokyo (JP); Shinji Hatae, Tokyo (JP); Akihisa Yamamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 4 days.

(21) Appl. No.: 09/954,172

(22) Filed: Sep. 18, 2001

(65) Prior Publication Data

US 2002/0153586 A1 Oct. 24, 2002

(30) Foreign Application Priority Data

Apr. 18, 2001 (JP) ............................ 2001-119248

(51) Int. Cl.[7] .................... H01L 29/00; H01L 27/01; H01L 27/12; H01L 23/62
(52) U.S. Cl. .................. 257/506; 257/501; 257/350; 257/361; 257/509
(58) Field of Search ................... 257/201–513, 257/327, 328, 329, 524, 526

(56) References Cited

U.S. PATENT DOCUMENTS

| | | | | |
|---|---|---|---|---|
| 4,214,315 A | * | 7/1980 | Anantha et al. | 357/44 |
| 4,631,570 A | * | 12/1986 | Birritella et al. | 257/501 |
| 4,860,081 A | * | 8/1989 | Cogan | 257/501 |
| RE34,158 E | * | 1/1993 | Watanabe et al. | 257/370 |
| 5,243,207 A | * | 9/1993 | Plumton et al. | 257/501 |
| 5,360,984 A | * | 11/1994 | Kirihata | 257/143 |
| 5,585,659 A | * | 12/1996 | Kobayashi et al. | 257/371 |
| 5,767,578 A | * | 6/1998 | Chang et al. | 257/717 |
| 6,051,868 A | * | 4/2000 | Watanabe et al. | 257/503 |
| 6,144,046 A | * | 11/2000 | Hanaoka et al. | 257/140 |
| 6,310,385 B1 | * | 10/2001 | Ajit | 257/524 |

FOREIGN PATENT DOCUMENTS

| | | |
|---|---|---|
| JP | 5-152574 | 6/1993 |
| JP | 11-54747 | 2/1999 |

* cited by examiner

Primary Examiner—Eddie Lee
Assistant Examiner—Jesse A Fenty
(74) Attorney, Agent, or Firm—Oblon, Spivak, McClelland, Maier & Neustadt, P.C.

(57) ABSTRACT

In a semiconductor substrate, semiconductor regions belonging to the IGBT are formed in an IGBT region and semiconductor regions belonging to the diode are formed in a diode region. The IGBT and the diode are connected in anti-parallel to each other. A trench in which an insulator is buried is formed between the IGBT region and the diode region. The insulator restricts the reverse recovery current which flows from the diode region into the IGBT region. Thus, semiconductor regions of an IGBT and a diode connected in anti-parallel with each other are fabricated in a single semiconductor substrate and the chip size is reduced.

3 Claims, 12 Drawing Sheets

FIG. 10 <BACKGROUND ART>

< BACKGROUND ART >

SEMICONDUCTOR DEVICE

BACKGROUND OF THE INVENTION

1. Field of the Invention

The present invention relates to a semiconductor device which is suitable for use in a power converter, such as an inverter.

2. Description of the Background Art

FIG. 10 is a vertical section showing a semiconductor device according to a conventional example as a background of the present invention. This semiconductor device 151 is formed as a vertical n-channel IGBT. The semiconductor substrate 200, a silicon substrate, comprises an n region 201, a p collector region 202, p base regions 203, and n source regions 205. These semiconductor regions 201 to 203 and 205 are formed by selectively introducing p-type and n-type impurities into the pair of main surfaces of the n-type substrate forming the n region 201. In the n-type substrate, the region where the semiconductor regions 201 to 203 and 205 are absent corresponds to the n region 201.

The p collector region 202 is formed selectively and exposed in the lower main surface of the semiconductor substrate 200. The p base regions 203 are selectively formed and selectively exposed in the upper main surface of the semiconductor substrate 200. The n source regions 205, shallower than the p base regions 203, are selectively formed inside the p base regions 203 and selectively exposed in the upper main surface of the semiconductor substrate 200.

The semiconductor device 151 further comprises gate electrodes 206, gate insulating films 207, insulating films 208, emitter electrodes 209, and a collector electrode 211. Each gate electrode 206 faces a channel region with the gate insulating film 207 interposed therebetween; the channel region is a part of the exposed surface of the p base region 203 that is interposed between the n region 201 and the n source regions 205. Each emitter electrode 209 is connected to the exposed surface of the p base region 203 and the n source regions 205 in the upper main surface of the semiconductor substrate 200. The insulating films 208 electrically insulate the gate electrodes 206 and the emitter electrodes 209. The collector electrode 211 is connected to the lower main surface of the semiconductor substrate 200 where the p collector region 202 is exposed.

In the use of the semiconductor device 151 as IGBT, with a positive collector voltage, relative to the emitter electrodes 209, applied to the collector electrode 211 (usually through a load), a gate voltage, relative to the emitter electrodes 209, is applied to the gate electrodes 206. When a positive gate voltage exceeding the threshold voltage is applied, an inversion layer is formed in the channel region, and electrons (the black dots in FIG. 10) are injected into the n region 201 and holes (the white dots in FIG. 10) are then injected from the p collector region 202 into the n region 201. As a result, a phenomenon known as conductivity modulation takes place in the n region 201, which causes the collector electrode 211 and the emitter electrodes 209 to become conductive to each other at a low on-state voltage. When the gate voltage is reduced below the threshold voltage (usually zero or negative value), the inversion layer formed in the channel region disappears and the collector electrode 211 and the emitter electrodes 209 are thus cut off.

As described above, the semiconductor device 151 as IGBT is a switching element advantageous because of its low on-state voltage and voltage controllability; however, unlike MOSFET, it does not contain a diode. Accordingly, when used in a power converter like an inverter, the semiconductor device 151 requires a free-wheeling diode provided outside. This produces the problem that the inductance of the interconnection hinders high-speed switching, and also makes the manufacturing process complicated and causes the applied equipment, such as a power converter, to be large-sized.

To solve these problems, Japanese Patent Application Laid-Open No.5-152574(1993) (which is hereinafter referred to as a first reference) discloses a semiconductor device in which semiconductor regions belonging to the IGBT and semiconductor regions belonging to the free-wheeling diode are disposed in different portions in a single semiconductor substrate. FIG. 11 shows a vertical sectional structure of a semiconductor device 152 and FIG. 12 shows a vertical sectional structure of a semiconductor device 153, both of which are disclosed in the first reference.

Each of the semiconductor devices 152 and 153 has a vertical n-channel IGBT and a vertical diode which are connected in anti-parallel to each other, where a plurality of semiconductor regions belonging to the IGBT and the diode are fabricated in a single semiconductor substrate 200. The semiconductor substrate 200, a silicon substrate, has an IGBT region 220 and a diode region 221 selectively defined in different regions along the pair of main surfaces. An anti-interference region 223 is provided between the IGBT region 220 and the diode region 221 as a region for suppressing interference between them.

The semiconductor substrate 200 has, in the IGBT region 220, part of the n region 201 that belongs to the IGBT, the p collector region 202, p base regions 203, and n source regions 205. The semiconductor substrate 200 also has, in the diode region 221, part of the n region 201 that belongs to the diode, an n⁺ region 241, and an anode region 204. The n region 201 functions as an n base region in the IGBT region 220 and as a cathode region in the diode region 221. The semiconductor device 152 further has p⁺ regions 240 and n⁺ regions 241 selectively formed in the IGBT region 220 and the anti-interference region 223. The semiconductor device 153 has p regions 230 selectively formed in the anti-interference region 223.

On the upper main surface of the semiconductor substrate 200, an anode electrode 210 is connected to the exposed surface of the anode region 204. A cathode electrode 212 is connected to the part of the lower main surface of the semiconductor substrate 200 which belongs to the diode region 221. The emitter electrodes 209 and the anode electrode 210 are connected to each other and the collector electrode 211 and the cathode electrode 212 are integrally coupled.

As described above, the semiconductor devices 152 and 153 each comprise an IGBT and a diode, where the diode connected in anti-parallel to the IGBT functions as a free-wheeling diode associated with the IGBT. Therefore, when the semiconductor device 152 or 153 is applied to a power converter such as an inverter, it is possible, in the assembly of the power converter, to remove the process of separately preparing the IGBT and the free-wheeling diode as separate semiconductor chips and connecting them with interconnection. This also makes the power converter compact. Moreover, since it is not necessary to connect the IGBT and the free-wheeling diode with interconnection, the problem that the switching speed is reduced by the interconnection inductance can be avoided to realize high speed switching.

However, the semiconductor devices 152 and 153 are disadvantageous in that they need the anti-interference region 223 to prevent interference between the IGBT and the diode. The interference between the IGBT and the diode means the phenomenon in which the reverse recovery current generated when the diode performs reverse recovery operation flows from the diode region 221 into the IGBT region 220 to cause a parasitic thyristor in the IGBT to conduct. Preventing the interference requires securing sufficiently large width L for the anti-interference region 223. Therefore the semiconductor devices 152 and 153 require larger area for the semiconductor substrate 200, or larger chip size.

SUMMARY OF THE INVENTION

The present invention has been made to solve the aforementioned problems of the conventional technique, and an object of the present invention is to provide a semiconductor device in which a plurality of semiconductor regions belonging to an IGBT and a diode are fabricated in a single semiconductor substrate and which enables reduction of the chip size.

A first aspect of the present invention is directed to a semiconductor device comprising a vertical IGBT and a vertical diode which are connected in anti-parallel with each other, wherein a plurality of semiconductor regions belonging to the IGBT and the diode are fabricated in a single semiconductor substrate. The semiconductor substrate comprises a pair of main surfaces, wherein among the plurality of semiconductor regions, ones that belong to the IGBT are formed in an IGBT region selectively defined along the pair of main surfaces, and ones that belong to the diode among the plurality of semiconductor regions are formed in a diode region selectively defined in a region different from the IGBT region along the pair of main surfaces, and wherein the semiconductor substrate further comprises an electrically insulating partition member selectively formed between the IGBT region and the diode region, for restricting a current flowing from one of the IGBT region and the diode region into the other.

Preferably, according to a second aspect, in the semiconductor device, a trench opening in one main surface of the pair of main surfaces is formed in a portion between the IGBT region and the diode region in the semiconductor substrate, and the partition member comprises an insulator buried in the trench.

Preferably, according to a third aspect, in the semiconductor device, the one main surface of the pair of main surfaces is the main surface on the opposite side to the other main surface where a collector region of the IGBT which belongs to the plurality of semiconductor regions is exposed.

Preferably, according to a fourth aspect, in the semiconductor device, the collector region extends from the IGBT region into the diode region across the portion.

Preferably, according to a fifth aspect, in the semiconductor device, the trench has a bottom reaching the collector region.

Preferably, according to a sixth aspect, in the semiconductor device, another trench is formed in the portion in the semiconductor substrate, the another trench opening in said other main surface and having a bottom protruding from the collector region, and the partition member further comprises another insulator buried in the another trench.

According to the first aspect of the present invention, the electrically insulative partition member effectively reduces interference between the IGBT and the diode, and the width of the ineffective region between the two can be set narrower to reduce the size of the device.

According to the second aspect, the partition member can be formed by a simple process of burying an insulator in a trench formed in the semiconductor substrate. Furthermore, the partition member can be formed in a narrow width and the size reduction of the device can be more effectively achieved.

According to the third aspect, the trench opens in the main surface opposite to the exposed surface of the collector region, so that the trench can be formed during the manufacturing process of forming the semiconductor regions, such as the IGBT's source region. That is to say, the device offers high productivity.

According to the fourth aspect, the collector region extends from the IGBT region into the diode region across the portion where the trench is formed. Therefore the partition member and the collector region can effectively restrict current flowing from one of the IGBT region and the diode region into the other. That is to say, the interference between the IGBT and the diode can be more effectively suppressed.

According to the fifth aspect, the bottom of the trench reaches the collector region, which still more effectively suppresses the current flowing from one of the IGBT region and the diode region into the other. That is to say, the interference between the IGBT and the diode can be still more effectively suppressed.

According to the sixth aspect, the device further comprises another trench which opens in said other main surface of the semiconductor substrate and has its bottom protruded from the collector region. Thus the insulators buried in the two trenches more effectively restrict the current flowing from one of the IGBT region and the diode region into the other. That is to say, the interference between the IGBT and the diode can be more effectively suppressed.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Outlines of the Device

Figure 1:
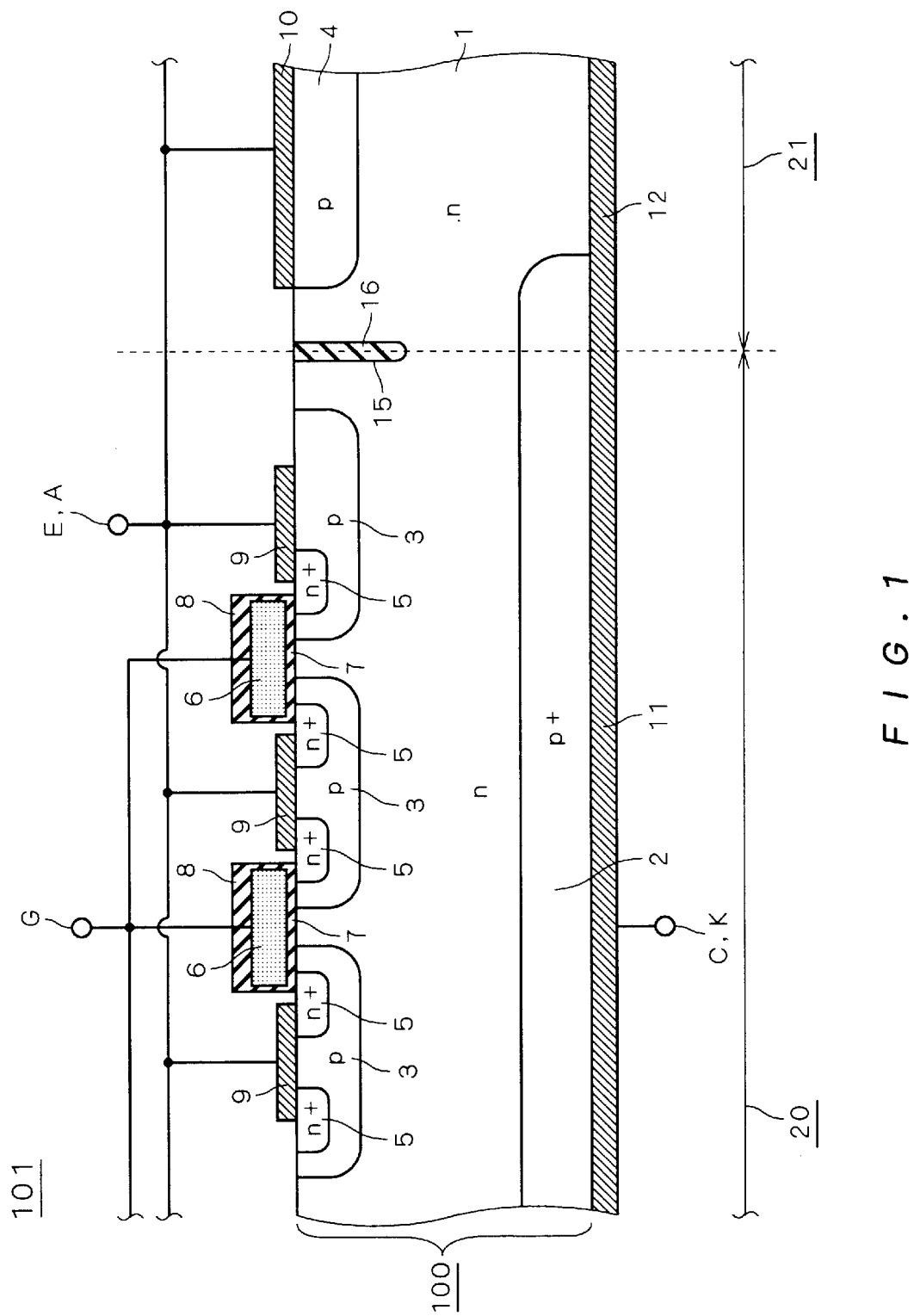
FIG. 1 is a vertical section of a semiconductor device according to a first preferred embodiment.

FIG. 1 is a vertical section of a semiconductor device according to a first preferred embodiment. This semiconductor device 101 comprises a vertical n-channel IGBT and a vertical diode which are connected in anti-parallel to each other, where a plurality of semiconductor regions 1 to 5 belonging to the IGBT and the diode are fabricated in a single semiconductor substrate 100. The term "vertical" indicates a semiconductor device of the type in which a pair of main electrodes are respectively disposed on one and the other of the pair of main surfaces of the semiconductor substrate 100 (the pair of main electrodes are emitter and collector electrodes in the IGBT and anode and cathode electrodes in the diode). The term "anti-parallel" indicates a parallel connection in which the forward current flows in opposite directions. Therefore the anti-parallel connection of the diode and the n-channel IGBT indicates a connection in which, as shown in FIG. 1, the anode electrode of the diode is connected to the emitter of the IGBT and the cathode electrode is connected to the collector electrode.

The semiconductor substrate 100, e.g. a silicon substrate, has a pair of main surfaces, where an IGBT region 20 and a diode region 21 are selectively defined in different regions along the pair of main surfaces. In this specification, for convenience of explanation, the main surface shown on the upper side in the drawing is referred to as "an upper main surface" and that shown on the lower side as "a lower main surface." Among the plurality of semiconductor regions 1 to 5, the IGBT region 20 of the semiconductor substrate 100 includes part of an n region 1 that belongs to the IGBT, a p collector region 2, p base regions 3, and n source regions 5. Also among the plurality of semiconductor regions 1 to 5, the diode region 21 of the semiconductor substrate 100 includes part of the n region 1 that belongs to the diode and an anode region 4 as a p well. The n region 1 functions as an n base region in the IGBT region 20 and as a cathode region in the diode region 21.

The p collector region 2, p base regions 3, anode region 4 and n source regions 5 are selectively formed in the pair of main surfaces of the semiconductor substrate 100 by selectively introducing p-type and n-type impurities into the pair of main surfaces of the n-type substrate forming the n region 1. In the n-type substrate, the portion where the semiconductor regions 2 to 5 are absent corresponds to the n region 1.

The p collector region 2 is formed selectively and exposed in the lower main surface of the semiconductor substrate 100 at least in the part belonging to the IGBT region 20. The p base regions 3 are selectively formed and selectively exposed in the upper main surface of the semiconductor substrate 100 in the part belonging to the IGBT region 20. The n source regions 5, shallower than the p base regions 3, are selectively formed inside the p base regions 3 and selectively exposed in the upper main surface of the semiconductor substrate 100. The anode region 4 is formed selectively and exposed in the upper main surface of the semiconductor substrate 100 in the part belonging to the diode region 21.

The semiconductor device 101 further comprises gate electrodes 6, gate insulating films 7, insulating films 8, emitter electrodes 9, an anode electrode 10, a collector electrode 11 and a cathode electrode 12. Each gate electrode 6 faces a channel region with the gate insulating film 7 interposed therebetween; the channel region is a part of the exposed surface of the p base region 3 that is interposed between the n region 1 and the n source regions 5. Each emitter electrode 9 is connected to the exposed surface of the p base region 3 and the n source regions 5 in the upper main surface of the semiconductor substrate 100. The insulating films 8 electrically insulate the gate electrodes 6 and the emitter electrodes 9. The collector electrode 11 is connected to the exposed surface of the p collector region 2 in the lower main surface of the semiconductor substrate 100. The anode electrode 10 is connected to the exposed surface of the anode region 4 in the upper main surface of the semiconductor substrate 100. The cathode electrode 12 is connected to the exposed surface of the part of the n region 1 that belongs to the diode region 21 in the lower main surface of the semiconductor substrate 100.

The emitter electrodes 9 and the anode electrode 10 are connected to each other through interconnection. The emitter electrodes 9 and the anode electrode 10 may be formed as parts of a single interconnection pattern and integrally coupled. The collector electrode 11 and the cathode electrode 12 are formed as part of a single electrode connected to the lower main surface of the semiconductor substrate 100, so they are integrally coupled.

Partition Member

The semiconductor device 101 further comprises an electrically insulative partition member selectively formed in the semiconductor substrate 100 between the IGBT region 20 and the diode region 21, for restricting current flowing from one of the IGBT region 20 and the diode region 21 into the other (tentatively referred to as interference current). More specifically, in the semiconductor substrate 100, a trench 15, opening in the upper main surface, is formed on the border between the IGBT region 20 and the diode region 21; an insulator 16 functioning as the partition member is buried in the trench 15. The insulator 16 may be composed of a silicon oxide, for example.

Figure 2:
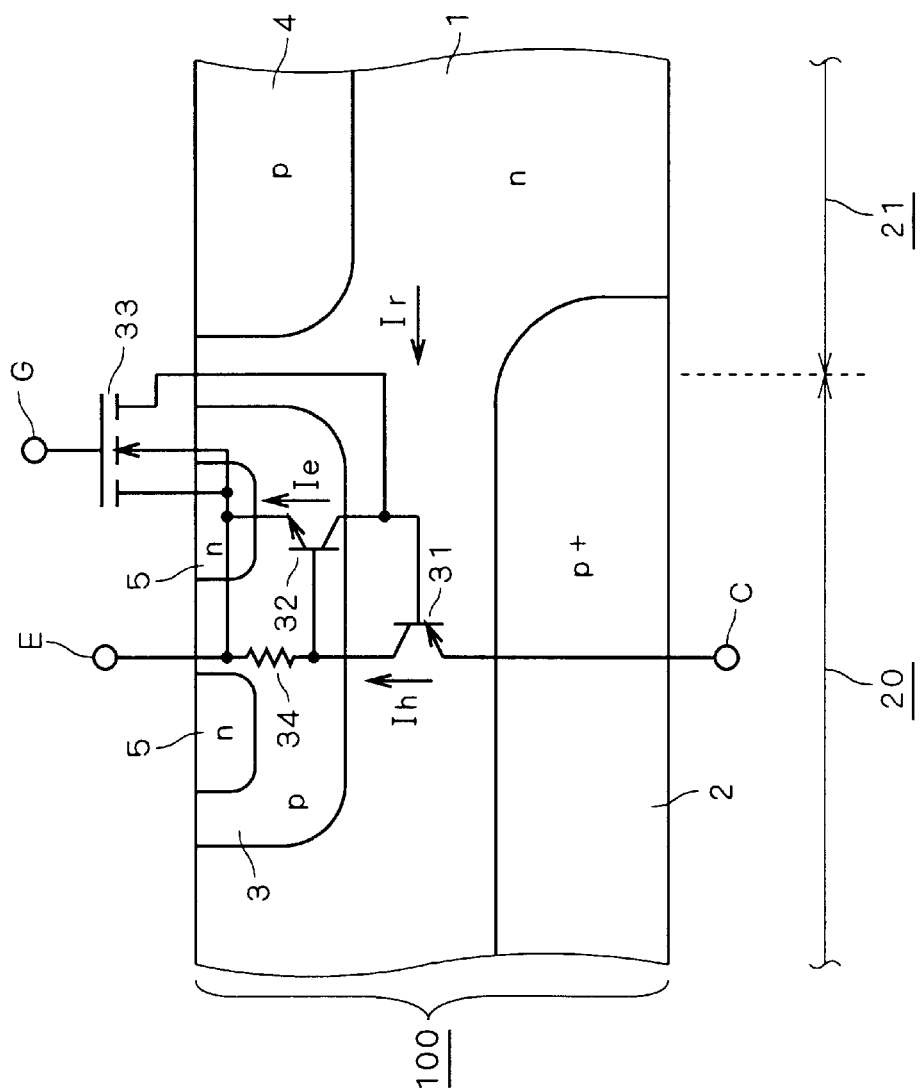
FIG. 2 is a diagram used to explain operation of a semiconductor device for comparison with the device shown in FIG. 1.

FIG. 2 is an explanation diagram for explaining the effect of the partition member, where the sectional structure of an imaginary semiconductor device with no partition member and its equivalent circuit are shown together. The IGBT region 20 includes equivalently formed pnp transistor 31, npn transistor 32, MOSFET 33 and resistor 34. The pnp transistor 31 has the p collector region 2, n region 1, and p base region 3, and the npn transistor 32 has the n region 1, p base region 3, and n source region 5. The MOSFET 33 has the n region 1 and the n source region 5 as its source/drain regions, the exposed surface of the p base region 3 as its channel region and the gate electrode 6 as its gate electrode. The resistor 34 is the resistance component of the p base region 3.

When the diode performs reverse recovery operation, a reverse recovery current Ir flows from the part of the n region 1 that belongs to the diode region 21 into the part belonging to the IGBT region 20. This reverse recovery current Ir functions as the aforementioned interference current. The reverse recovery current Ir passes through the p base region 3 and flows into the emitter electrode 9 (E). Due to this current, a voltage drop occurs in the resistor 34 of the p base region 3 and then the npn transistor 32 becomes conductive. The electron current Ie flowing in the npn transistor 32 functions as a base current for the pnp transistor 31. As a result, the pnp transistor 31 becomes conductive and then the hole current Ih flowing in the pnp transistor 31 contributes to voltage drop in the resistor 34. In this way, despite that the MOSFET 33 does not turn on, the collector electrode 11 (C) and the emitter electrode 9 (E) stay conductive to each other. That is to say, in the device shown in FIG. 2, the reverse recovery current Ir may cause latchup, i.e. the phenomenon that the parasitic thyristor in the IGBT becomes conductive. The latchup cannot be controlled with a voltage applied to the gate electrode 6 (G).

In contrast, in the semiconductor device 101, the insulator 16 functioning as a partition member restricts the reverse recovery current Ir flowing as an interference current from the diode region 21 into the IGBT region 20. This suppresses occurrence of the latchup. The trench 15 is formed deeper than the anode region 4 so that the insulator 16 can effectively function as the partition member. Further, in order to further enhance the function of the partition member, the trench 15 is formed right above the p collector region 2. In other words, the collector region 2 extends from the IGBT region 20 into the diode region 21 across the part located right under the trench 15.

Advantages of the Device

The semiconductor device 101 constructed as described above offers the following advantages. First, since the semiconductor device 101 has an IGBT and a diode and the diode is connected in anti-parallel to the IGBT, the diode functions as a free-wheeling diode associated with the IGBT. Hence, when the semiconductor device 101 is used in a power converter such as an inverter, it is possible, in the assembly of the power converter, to remove the process of separately preparing the IGBT and the free-wheeling diode as separate semiconductor chips and connecting them with interconnection. Also, the power converter can be formed compact. Furthermore, since it is not necessary to connect the IGBT and the free-wheeling diode with interconnection, the problem that the switching speed is reduced by the interconnection inductance can be avoided to realize high speed switching.

Moreover, since the semiconductor device 101 comprises the electrically insulating partition member, the interference between the IGBT and the diode can be effectively reduced, and besides the width of the ineffective region between them (the width L in the conventional devices 152 and 153) can be narrower, which realizes size reduction of the device. That is to say, the power converter can be further downsized. In addition, in the semiconductor device 101, the partition member is formed by a simple process of burying the insulator 16 in the trench 15 formed in the semiconductor substrate 100. Moreover, the partition member can be formed in a small width, so as to more effectively achieve the size reduction.

Furthermore, the trench 15 is formed to open in the upper main surface of the semiconductor substrate 100 where the n source regions 5 and the like are formed, i.e. in the surface of the semiconductor substrate 100 which is processed in the semiconductor process, so that the trench 15 can be easily formed in the semiconductor process. That is to say, the partition member can be formed without reducing the productivity. Further, since the p collector region 2 extends from the IGBT region 20 into the diode region 21 across the portion where the trench 15 is formed, the insulator 16 as the partition member and the p collector region 2 can effectively suppress the interference current. That is to say, the interference between the IGBT and the diode can be more effectively suppressed.

Second Preferred Embodiment

Figure 3:
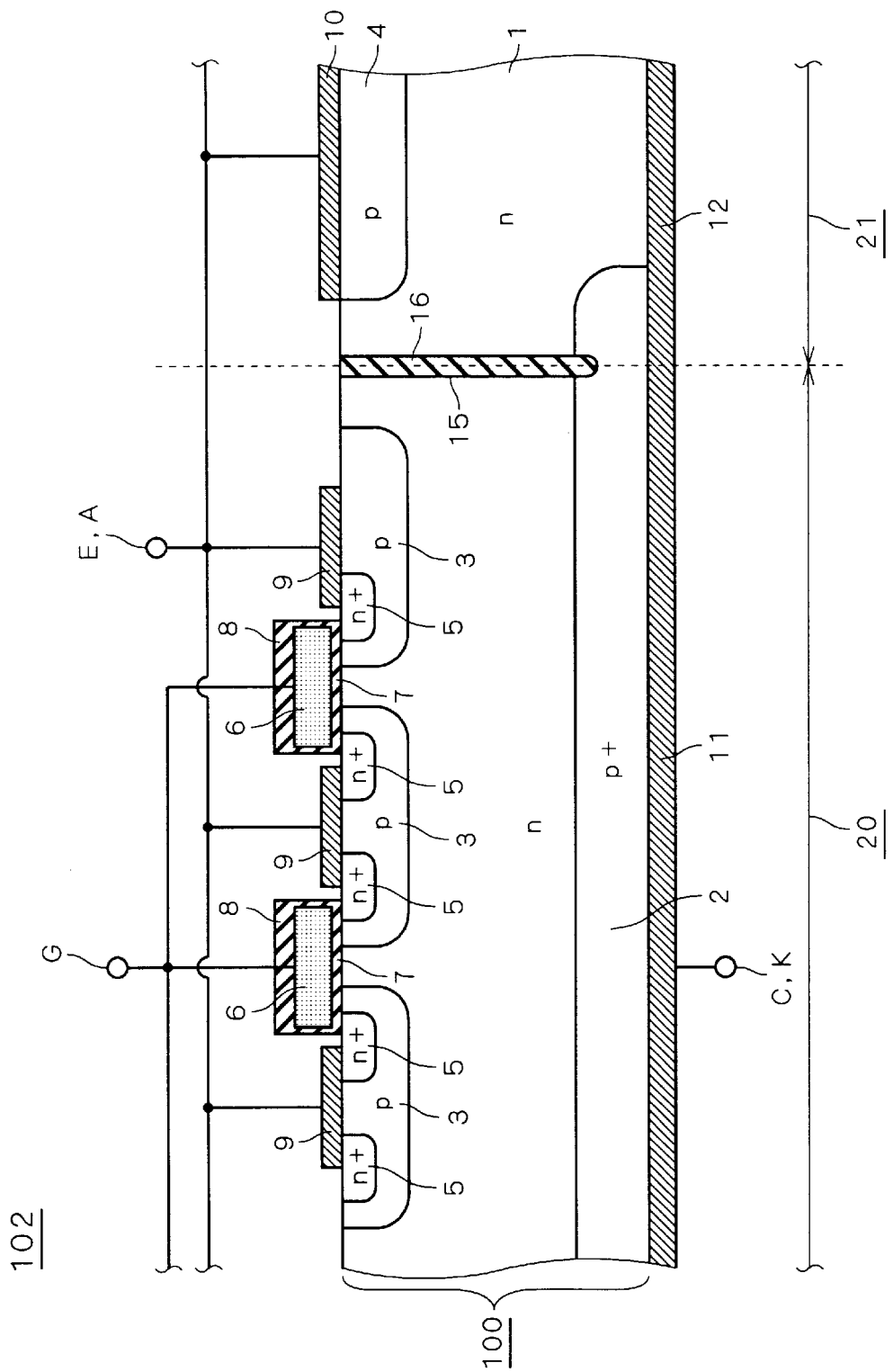
FIGS. 3 to 5 are vertical sections respectively showing semiconductor devices according to first to third examples of a second preferred embodiment.

This preferred embodiment shows semiconductor devices which are constructed to further enhance the effect of suppressing the interference between the IGBT and the diode. FIG. 3 shows a vertical sectional structure of a semiconductor device 102, where the bottom of the trench 15 reaches the p collector region 2. This still more effectively suppresses the interference current flowing between the IGBT region 20 and the diode region 21.

Figure 4:
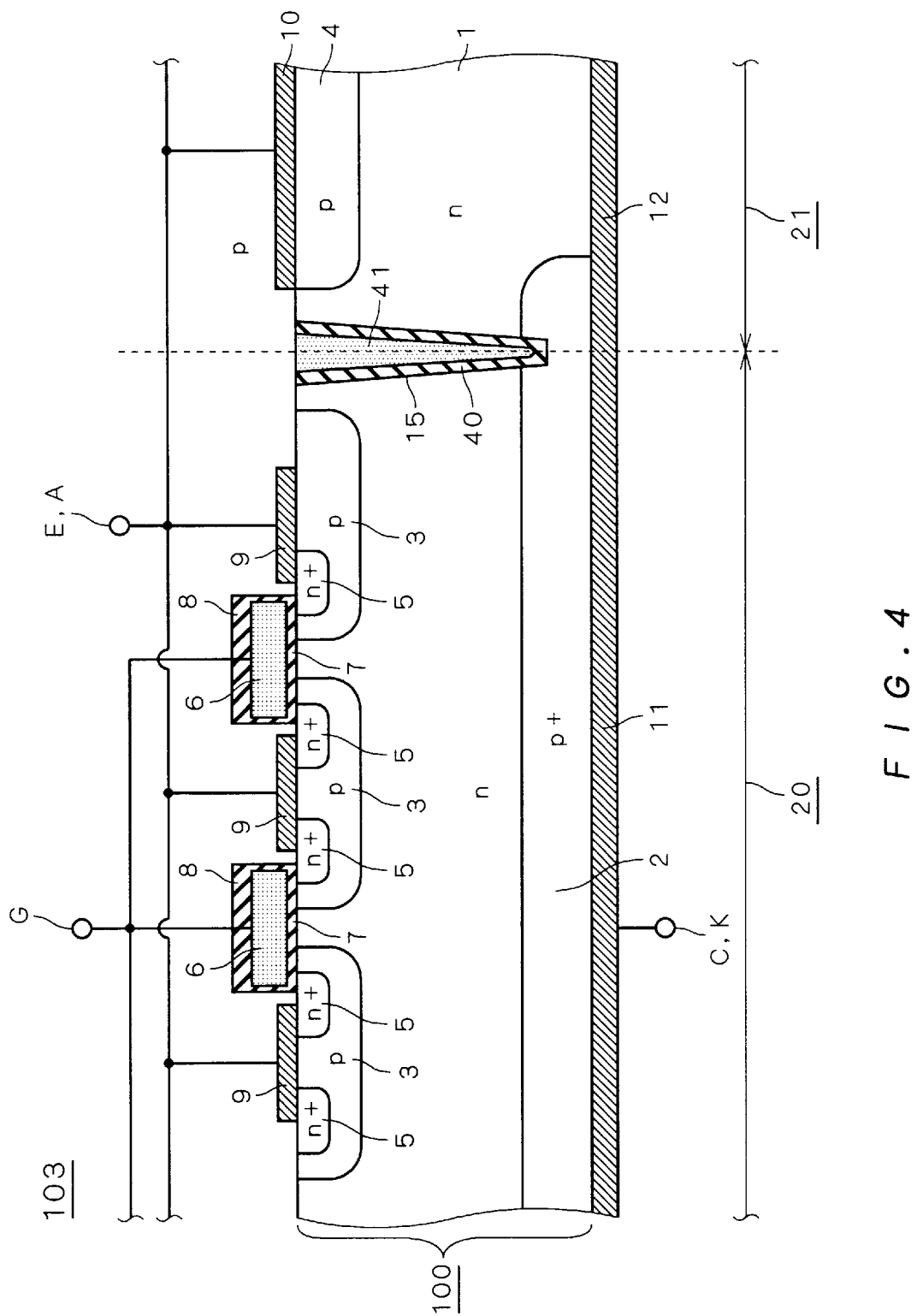

FIG. 4 shows a vertical sectional structure of a semiconductor device 103 where the width of the opening of the trench 15 is wider than that in the semiconductor device 102. Further, an insulator 40 as insulating film is buried to cover the inner wall of the trench 15 and polysilicon 41 is buried on the insulator 40. In this specification, an insulator "buried" in the trench 15 also includes the insulator 40 provided as a film covering the inner wall of the trench 15. Forming a wider opening facilitates the manufacturing process when the trench 15 is deeper. That is to say, the semiconductor device 103 has an advantage over the semiconductor device 102 in that its manufacture is easier. The structure in which the insulator 40 as insulating film and the polysilicon 41 are buried as shown in the semiconductor device 103 can be used also when the trench 15 is not so deep as shown in the semiconductor device 102, e.g. when it is formed like that in the semiconductor device 101.

Figure 5:
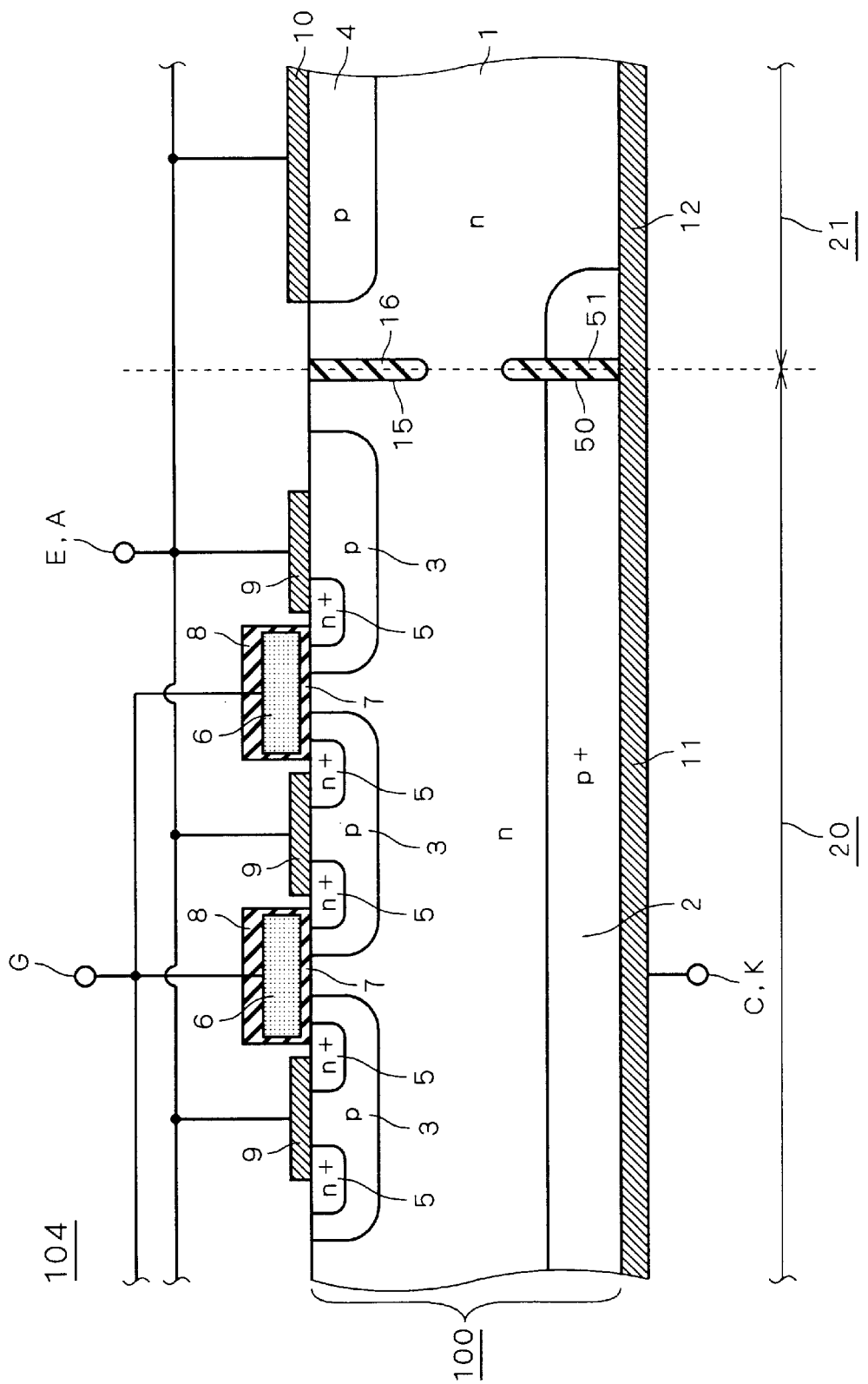

FIG. 5 shows a vertical sectional structure of a semiconductor device 104 that has another trench 50; this trench 50 is formed in the semiconductor substrate 100 on the border between the IGBT region 20 and the diode region 21 and opens in the lower main surface of the semiconductor substrate 100. The trench 50, too, has an insulator 51 buried therein and functioning as a partition member. The insulator 51 may be composed of the same material as the insulator 16, for example. The trench 50 is formed opposite to the trench 15, with the bottom of the trench 50 (the upper end in FIG. 5) protruding upward from the p collector region 2.

In the semiconductor device 104, the insulators 16 and 51 buried in the two trenches 15 and 50 more effectively suppress the interference current flowing between the IGBT region 20 and the diode region 21. That is to say, the interference between the IGBT and the diode can be more effectively suppressed. The trench 50 may be structured like the trench 15 having a larger opening as shown in the semiconductor device 103 (FIG. 4), and the insulator 40 as insulating film and the polysilicon 41 may be buried in the trench 50, in place of the insulator 51.

Figure 6:
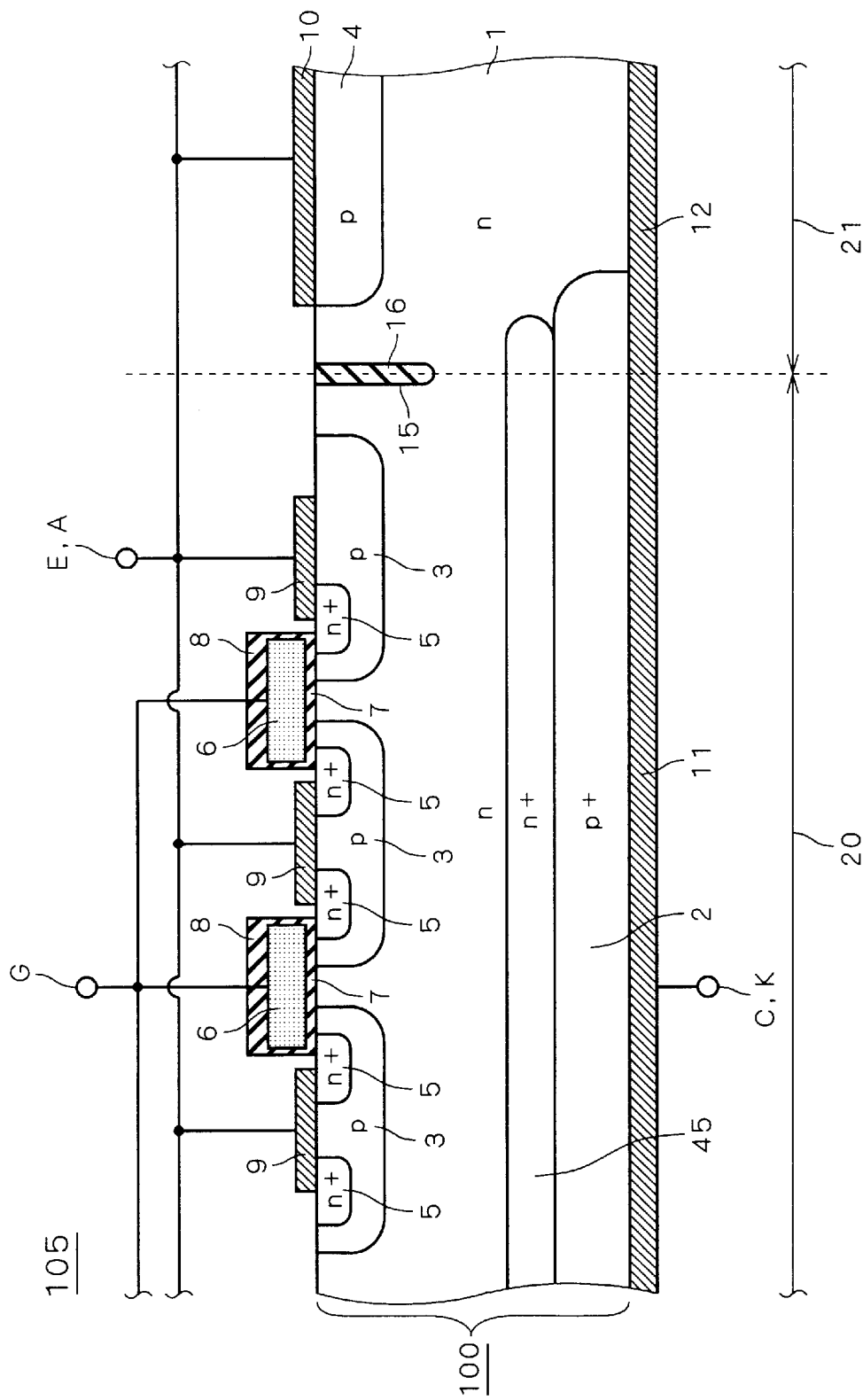
FIGS. 6 to 9 are vertical sections respectively showing semiconductor devices according to first to fourth variations.

Variations (1) While the preferred embodiments above have shown, as examples, non-punchthrough type IGBTs, the IGBT may be of punchthrough type like the semiconductor device 105 shown in FIG. 6. The semiconductor device 105 characteristically differs from the semiconductor device 101 in that the n region 1 includes an $n^+$ region 45 with higher impurity concentration formed in contact with the p collector region 2.

Figure 7:
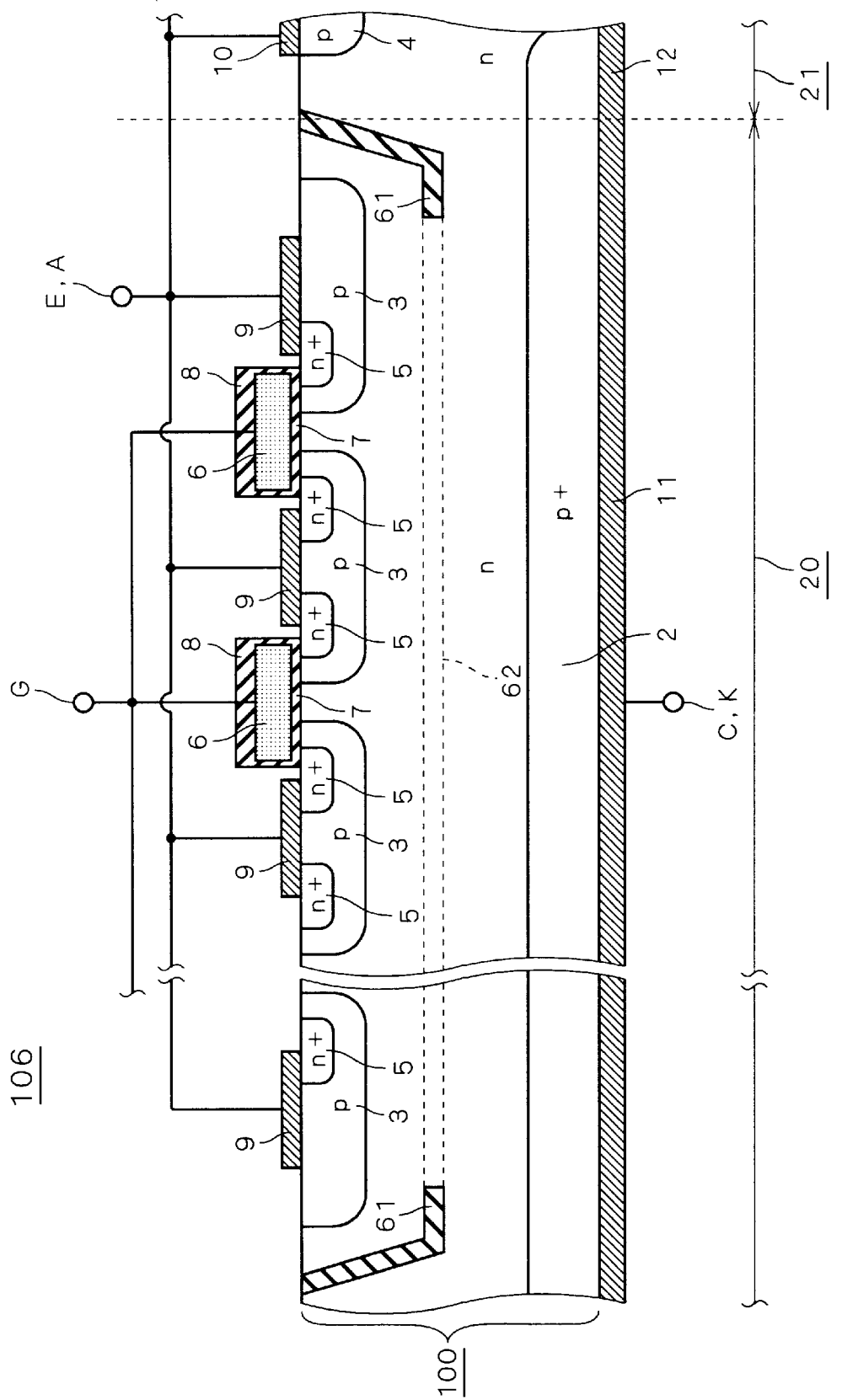
Figure 8:
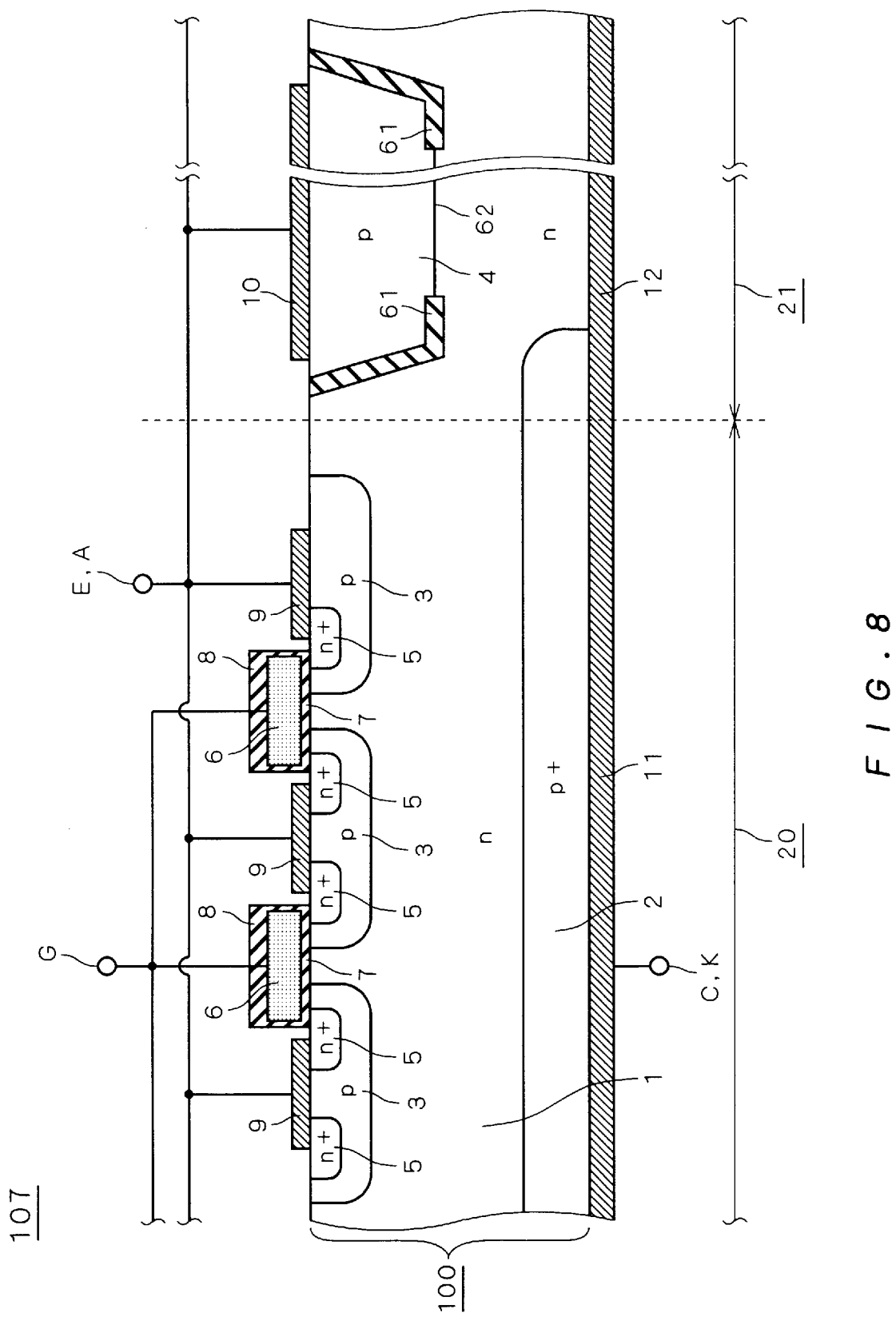

(2) While the preferred embodiments above have shown examples in which the partition member is an insulator buried in a trench, other structures can be used as the partition member. The examples include the semiconductor device 106 shown in FIG. 7 and the semiconductor device 107 shown in FIG. 8. The semiconductor devices 106 and 107 both use known dielectric isolation, where an area of the upper main surface of the semiconductor substrate 100 is surrounded like an island by an insulator 61 having its part 62 removed. The material of the insulator 61 may be a silicon oxide, for example. In both of the semiconductor devices 106 and 107, the insulator 61 functions as a partition member.

Figure 9:
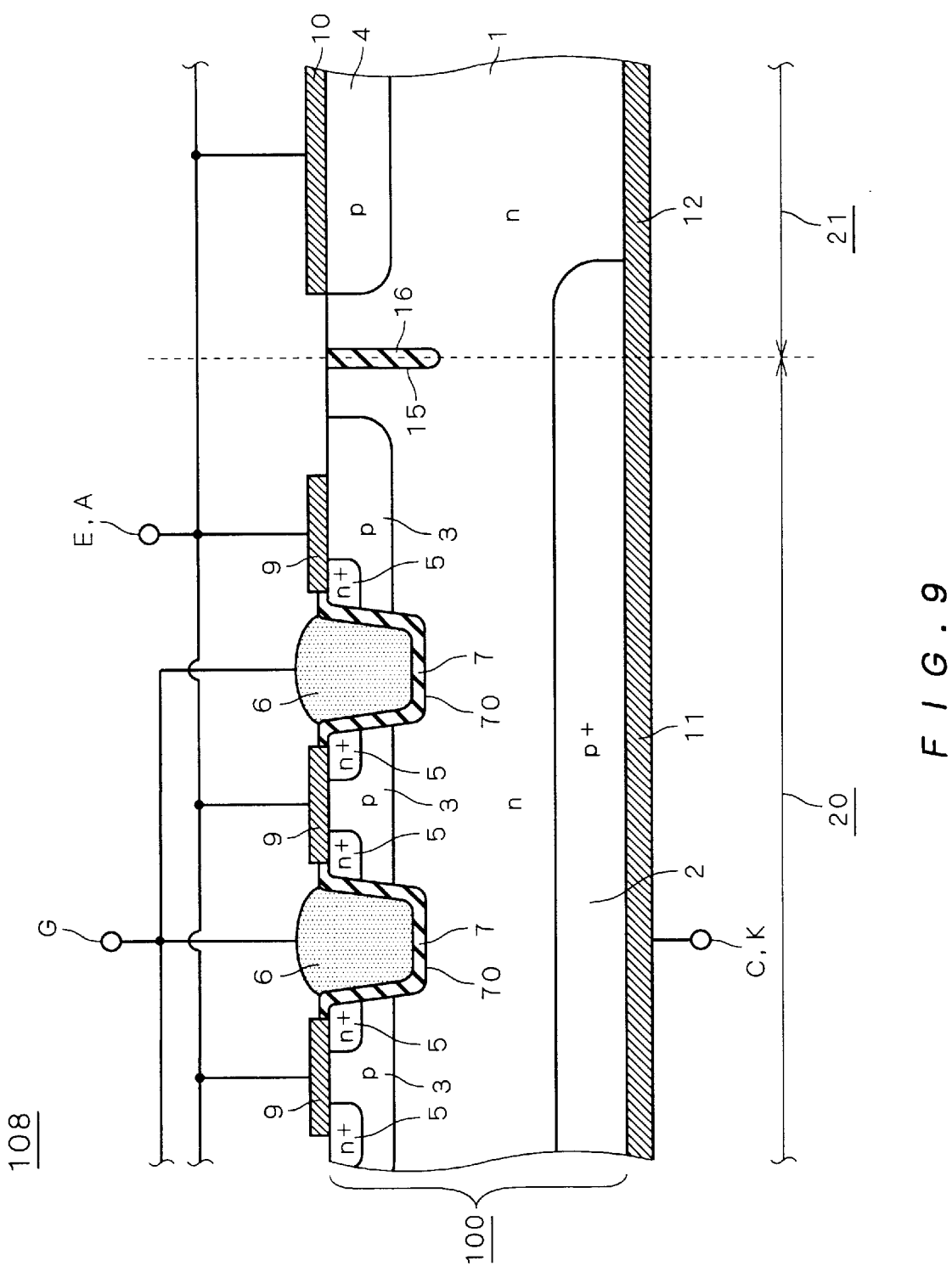
Figure 10:
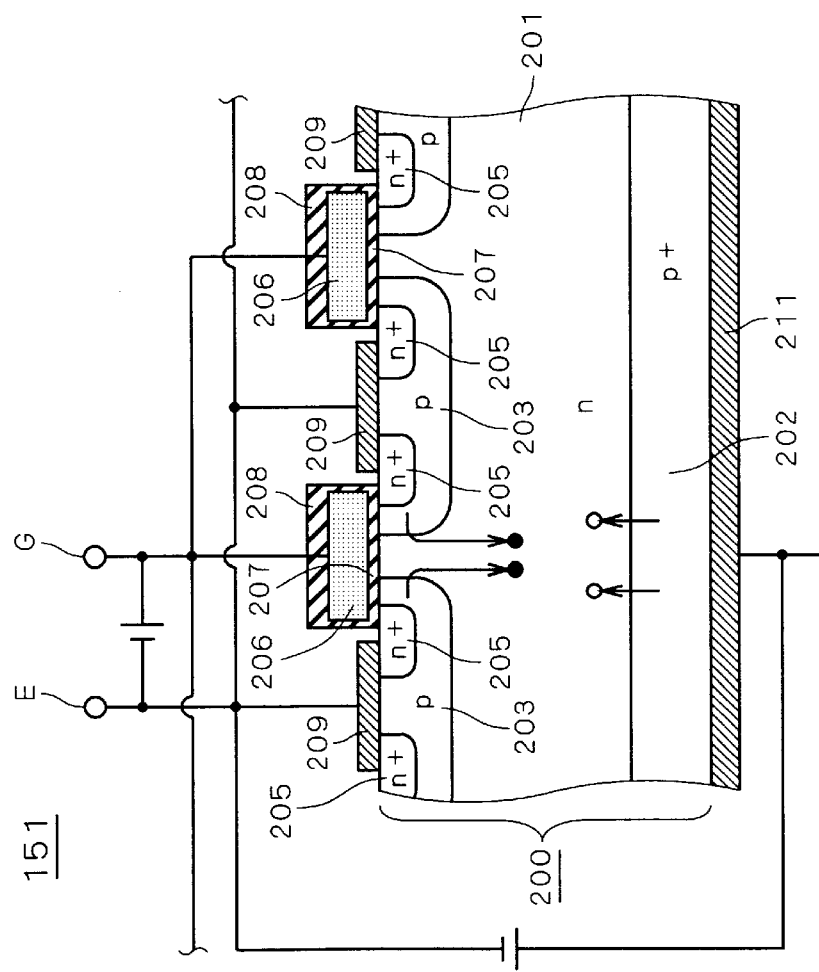
FIGS. 10 to 12 are vertical sections respectively showing semiconductor devices according to first to third conventional examples.

(3) While the preferred embodiments above have shown, as examples, planar type IGBTs, i.e. the gate electrodes 6 face the upper main surface of the semiconductor substrate 100, the IGBT may be of the trench type like the semiconductor device 108 shown in FIG. 9. In the semiconductor device 108, trenches 70 are selectively formed in the semiconductor substrate 100, where each trench 70 selectively opens in the upper main surface of the semiconductor substrate 100 and extends through the n source region 5 and the p base region 3. A gate insulating film 7 is buried in the trench 70 to cover the inner wall of the trench 70, and a gate electrode 6 is buried on the gate insulating film 7. Also in this structure, the gate electrode 6 faces the channel region with the gate insulating film 7 interposed therebetween; the channel region is the part of the exposed surface of the p base region 3 (in this case, the surface exposed to the trench 7, which is part of the surface of the semiconductor substrate 100) that is interposed between the n source region 5 and the n region 1.

Figure 11:
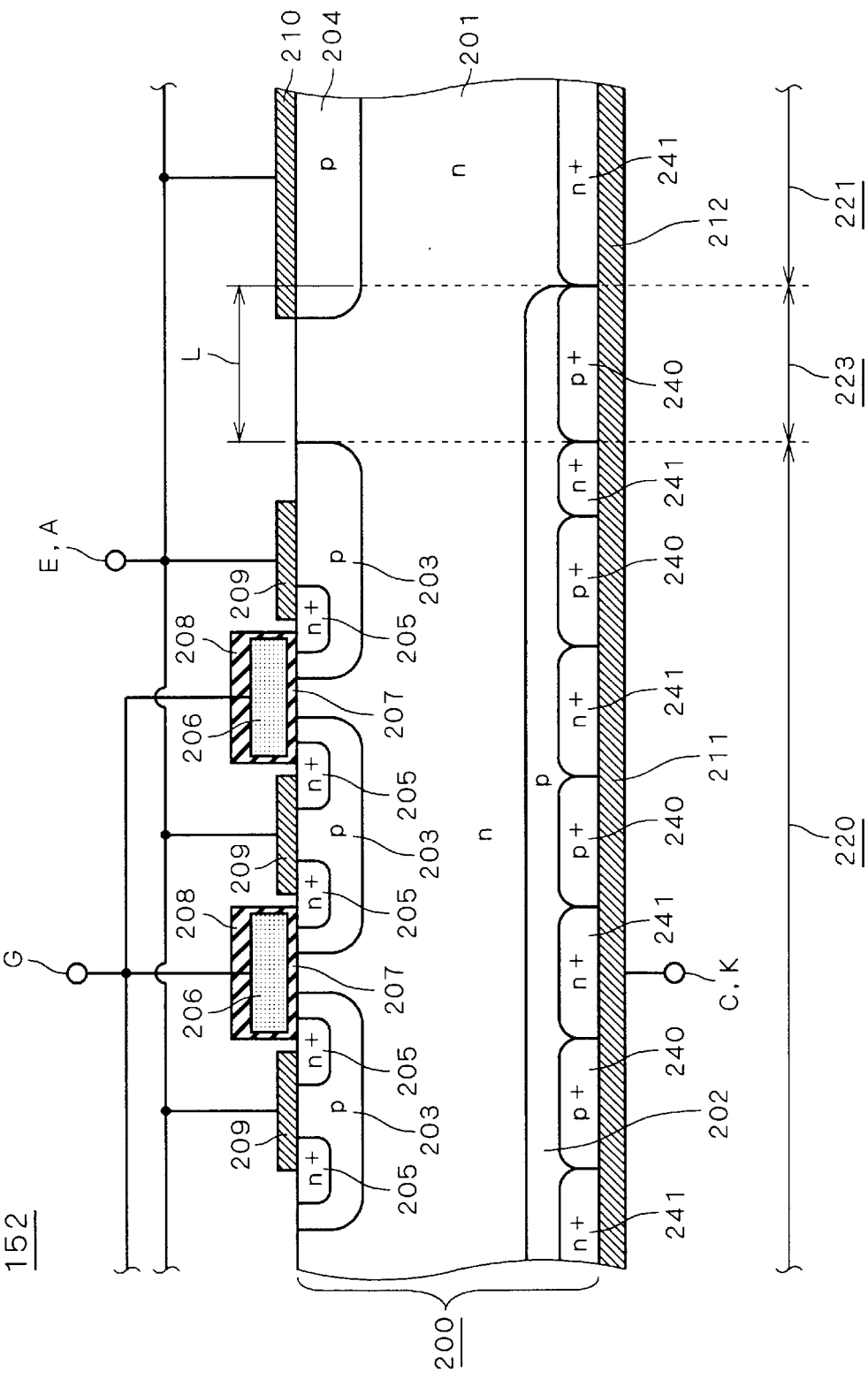
Figure 12:
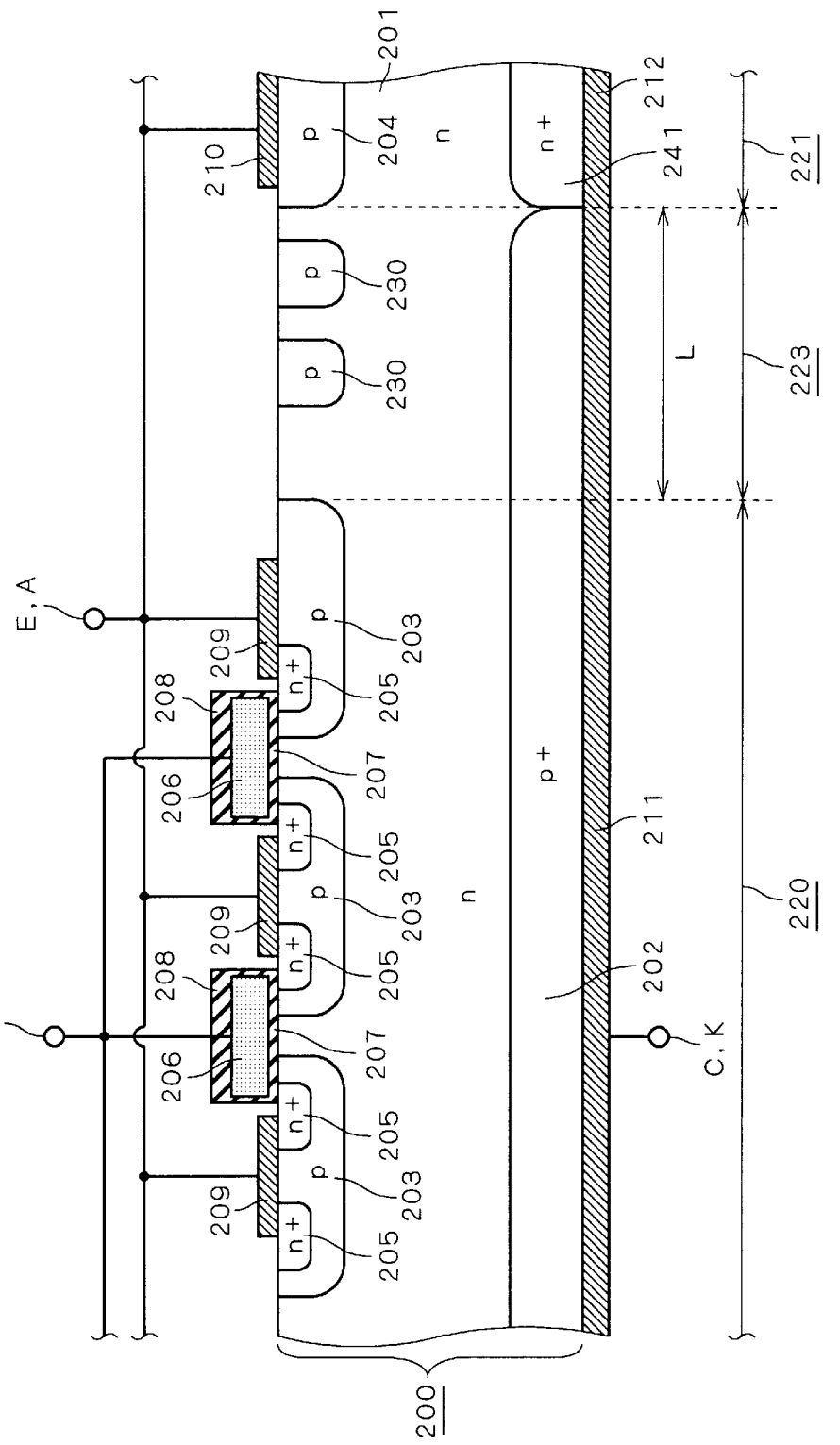

(4) While the preferred embodiments above have shown examples in which the n$^+$ region 241 shown in FIG. 11 or FIG. 12 is not formed in the diode region 21, the n$^+$ region 241 may be formed as shown in FIG. 11 or 12 in the portion belonging to the diode region 21 in the lower main surface of the semiconductor substrate 100.

While the invention has been described in detail, the foregoing description is in all aspects illustrative and not restrictive. It is understood that numerous other modifications and variations can be devised without departing from the scope of the invention.

What is claimed is:

1. A semiconductor device comprising:

a vertical IGBT and a vertical diode which are connected in anti-parallel with each other, wherein a plurality of semiconductor regions belonging to said IGBT and said diode are fabricated in a single semiconductor substrate having a pair of main surfaces, wherein among said plurality of semiconductor regions, ones that belong to said IGBT are formed in an IGBT region selectively defined along said pair of main surfaces, and ones that belong to said diode among said plurality of semiconductor regions are formed in a diode region selectively defined in a region different from said IGBT region along said pair of main surfaces, wherein said semiconductor substrate further comprises an electrically insulating partition member selectively formed between said IGBT region and said diode region, for restricting a current flowing from one of said IGBT region and said diode region into the other, wherein a first trench opening in one main surface of said pair of main surfaces is formed in a portion between said IGBT region and said diode region in said semiconductor substrate, said partition member comprising an insulator buried in said first trench, wherein said first trench has a bottom portion which does not extend through the entire semiconductor substrate, wherein a second trench is formed opposite to the first trench in the portion between the IGBT region and the diode region, said second trench opening in the other main surface and having a bottom protruding from the collector region towards the first trench, and wherein said partition member further includes another insulator buried in the second trench.

2. The semiconductor device according to claim 1, wherein said one main surface of said pair of main surfaces is the main surface on the opposite side to the other main surface where a collector region of said IGBT which belongs to said plurality of semiconductor regions is exposed.

3. The semiconductor device according to claim 2, wherein said collector region extends from said IGBT region into said diode region across said portion.

* * * * *